(12) United States Patent
Heuck et al.

(10) Patent No.: US 9,428,378 B2
(45) Date of Patent: Aug. 30, 2016

(54) COMPONENT INCLUDING TWO SEMICONDUCTOR ELEMENTS BETWEEN WHICH AT LEAST TWO HERMETICALLY TIGHTLY SEALED CAVITIES HAVING DIFFERENT INTERNAL PRESSURES ARE FORMED AND METHOD FOR MANUFACTURING SUCH A COMPONENT

(71) Applicant: Robert Bosch GmbH, Stuttgart (DE)

(72) Inventors: Friedjof Heuck, Stuttgart (DE); Lars Tebje, Reutlingen (DE); Heiko Stahl, Reutlingen (DE); Jullian Gonska, Reutlingen (DE); Reinhard Neul, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/731,032

(22) Filed: Jun. 4, 2015

(65) Prior Publication Data
US 2015/0353346 A1 Dec. 10, 2015

(30) Foreign Application Priority Data

Jun. 6, 2014 (DE) .................. 10 2014 210 857

(51) Int. Cl.
| | |
|---|---|
| *H01L 23/00* | (2006.01) |
| *B81B 7/00* | (2006.01) |
| *B81C 1/00* | (2006.01) |
| *B81B 7/02* | (2006.01) |
| *H01L 23/02* | (2006.01) |
| *H01L 23/10* | (2006.01) |
| *H01L 21/50* | (2006.01) |

(52) U.S. Cl.
CPC ............... *B81B 7/0038* (2013.01); *B81B 7/02* (2013.01); *B81C 1/00285* (2013.01); *B81B 2203/0315* (2013.01); *B81C 2203/0145* (2013.01); *H01L 21/50* (2013.01); *H01L 23/02* (2013.01); *H01L 23/10* (2013.01)

(58) Field of Classification Search
CPC .................................................... H01L 21/268
See application file for complete search history.

(56) References Cited

U.S. PATENT DOCUMENTS

2014/0117472 A1* 5/2014 Gonska ............... B81C 1/00293
257/415

* cited by examiner

*Primary Examiner* — William Harriston
(74) *Attorney, Agent, or Firm* — Norton Rose Fulbright US LLP

(57) ABSTRACT

For the targeted influencing of the internal pressure within a cavity between two elements of a component, a getter material or an outgassing material is situated in an additional cavity between the two elements. After the two elements are bonded to one another, the additional cavity is still to be joined via a connecting opening to the cavity. The getter material or the outgassing material is then activated so that gasses are bound in the additional cavity and in the connected cavity, or an outgassing takes place. Only when the sought internal pressure has established itself in the connected cavity is the connecting opening to the additional cavity closed. In this way, the getter material or the outgassing material is only used for establishing a defined internal pressure, but no longer has any influence on the internal pressure within the cavity during ongoing operation of the component.

9 Claims, 1 Drawing Sheet

COMPONENT INCLUDING TWO SEMICONDUCTOR ELEMENTS BETWEEN WHICH AT LEAST TWO HERMETICALLY TIGHTLY SEALED CAVITIES HAVING DIFFERENT INTERNAL PRESSURES ARE FORMED AND METHOD FOR MANUFACTURING SUCH A COMPONENT

BACKGROUND OF THE INVENTION

1. Field of the Invention

The present invention relates to a component including at least two semiconductor elements which are connected to one another via at least one structured connecting layer, at least two hermetically tightly sealed cavities, in which different defined internal pressures prevail, being formed between these two elements. At least one of those cavities is sealed by a circumferential bonding frame in the connecting layer. Moreover, the present invention relates to a method for manufacturing such a component.

2. Description of the Related Art

One important exemplary application for the components mentioned here are so-called IMUs (inertial measurement units) including a MEMS (microelectromechanical system) element which includes a rotation rate sensor component as well as an acceleration sensor component. The two sensor components are formed in the layer structure of the MEMS element and situated next to one another. They are capped with the aid of the second element in order to protect the sensor structures and to ensure defined pressure conditions for the respective sensor operation. Since rotation rate sensors and acceleration sensors are usually operated at different ambient pressures, an individual cap structure is provided in the second element for each sensor structure. In rotation rate sensors, a part of the sensor structure is driven resonantly. In order to keep the damping of the sensor structure preferably low, a preferably low internal pressure of approximately 1 mbar is set in the cavity of a rotation rate sensor element. The rotation rate sensor may then be operated even at a relatively low excitation voltage. In contrast thereto, the sensor structure of an acceleration sensor is to preferably not be excited to vibrations. For this reason, acceleration sensors are operated at a significantly higher internal pressure of typically 500 mbar.

The internal pressure which results within a cavity between two elements joined by bonding is a function of the ambient pressure at which the bonding process is carried out. For this reason, the implementation of cavities having a different internal pressure for the individual sensor components of a MEMS element requires special measures when the two, sensor components are to be capped only with another element and in one single bonding step.

This is the object on which US patent application publication 2012/0326248 A1 is based. In this publication, it is suggested, among other things, to provide, in the area of a cavity, one of the element surfaces to be joined with a getter material or an outgassing material which bonds or releases a defined amount of gas at a corresponding temperature treatment. In this way, a targeted decrease or increase of the internal pressure of the cavity is to be effectuated.

This procedure is problematic for multiple reasons. In practice, it has been found that the internal pressure in such a cavity often changes even after the sensor calibration, since the getter material post-getters or the outgassing material gasses out further. This ultimately results in a distortion of the measurement results. But the micromechanical sensor function is often also interfered with by the extraneous materials in the cavity. Material ruptures repeatedly occur in particular in getter layers. This results in individual particles breaking off, which settle in or at the sensor structure and whose mobility is limited.

BRIEF SUMMARY OF THE INVENTION

With the present invention, the known use of getter materials and outgassing materials for the targeted influencing of the internal pressure within a cavity between two elements is further developed in that these materials are only used for setting a defined internal pressure, but no longer have any influence on the internal pressure within the cavity during ongoing operation of the component.

This is achieved according to the present invention by the getter material or the outgassing material being situated in an additional cavity between the two elements, this additional cavity being connected after the bonding process via a connecting opening with at least one of the cavities to be sealed. The getter material or the outgassing material is, activated after the establishment of the bond connection so that gasses are bound in the additional cavity and the connected cavity, or an outgassing takes place. Only when the sought internal pressure has established itself in the connected cavity is the connecting opening to the additional cavity closed, preferably in a laser welding process.

Therefore, at least one of the cavities of the component according to the present invention is sealed via a circumferential bonding frame in the connecting layer between the two elements, while at least one other cavity of the component according to the present invention is at least in areas sealed using a welding joint between the two elements.

According to the present manufacturing method, at least one further cavity is provided in addition to the at least two cavities which are to be sealed between the two elements, for example, by creating another cavity recess in at least one of the two element surfaces, or wafer surfaces, to be joined. At least one of the two surfaces to be joined is then provided with a getter material or an outgassing material in the area of this additional cavity. Furthermore, the connecting layer is structured in such a way that at least one cavity is hermetically tightly sealed after the bonding process and that there is at least one connecting opening as pressure connection between the additional cavity and at least one further cavity to be sealed. After establishing the bond connection, the getter material or the outgassing material is activated so that gasses are bound in the additional cavity and in the connected cavity, or an outgassing takes place. Only when the sought internal pressure has established itself in the connected cavity is the connecting opening closed.

This procedure according to the present invention enables the implementation of multiple, hermetically tightly enclosed cavities between two elements having different defined internal pressures. The internal pressure which has established itself after the bonding process for joining the two elements within the cavities is decreased or increased in a defined way in at least one of the cavities with the aid of a getter material or an outgassing material, this material not being situated in the cavity itself, however, but in an additional cavity. This cavity is connected to the cavity to be influenced via a connecting opening. The internal pressure set in this way is then "frozen" by decoupling the additional cavity having the getter material or the outgassing material. For this purpose, the connecting opening is closed. In this way it is not only prevented that the internal pressure of a cavity changes retroactively due to uncontrolled post-gettering or outgassing, but also that particles of the extraneous material, i.e., of the getter material or of the outgassing material, influence the component functions.

As mentioned above, the connecting opening is preferably closed in a laser welding process using an infrared laser. Since semiconductor materials, such as, for example, silicon, are transparent to light in the infrared spectrum, an infrared laser beam may be focused easily through the semiconductor material in the area of the connecting surface between the two semiconductor elements. In this way, the semiconductor material may be partially melted, in this area, but also a metallic coating of the element surface [may be partially melted].

In this way, the hermetically tight welding joint may also be established between the semiconductor materials of the two element surfaces to be joined or also between the semiconductor material of the one component surface to be joined and a metallic coating on the other element surface. When the two elements are joined with one another using eutectic bonding, one of the two bonding layers may easily be used as a metallic coating for the laser welding. For this purpose, the two bonding layers have to only be structured in a suitable way in the area of the connecting opening.

Generally, micromechanical structures and/or electronic circuit elements, which are to be capped, are formed in the surface of the one element. For this purpose, the surface of the other component is often structured in order to implement cap recesses for the individual function elements. Advantageously, at least one depression is created as an additional cavity recess. This cavity recess may have a different depth than the cavity recesses. When the getter material or the outgassing material is to be applied to the structured cap bottom side, it is advantageous to not form the depression for the additional cavity too deeply, since the material may then be deposited and structured using standard processes.

Depending on the design, the additional, hermetically tightly sealed cavity having the getter material may remain in the structure of the component according to the present invention or it may also be separated from the structure.

Generally, such components are manufactured in the wafer composite. For this purpose, the two elements are each produced in the wafer composite, the bond connection between the two elements is produced in the wafer composite and also the subsequent closing of the connecting opening takes place in the wafer composite. When the at least one additional cavity is situated in the border area of the component, it may be easily separated when separating the component. This proves to be particularly advantageous in particular with regard to a preferably extensive miniaturization of the components since no chip surface has to be reserved for the additional cavity.

DETAILED DESCRIPTION OF THE INVENTION

Figure 1A:
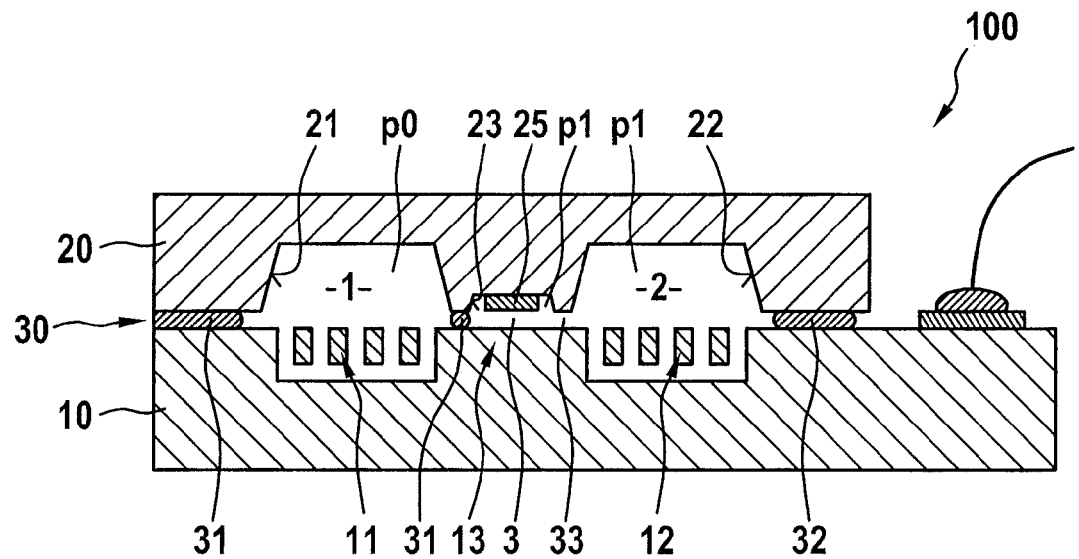
FIG. 1a schematically shows a cross-sectional view of MEMS element 10 and of cap element 20 of a component 100 according to the present invention after the bonding step.
Figure 1B:
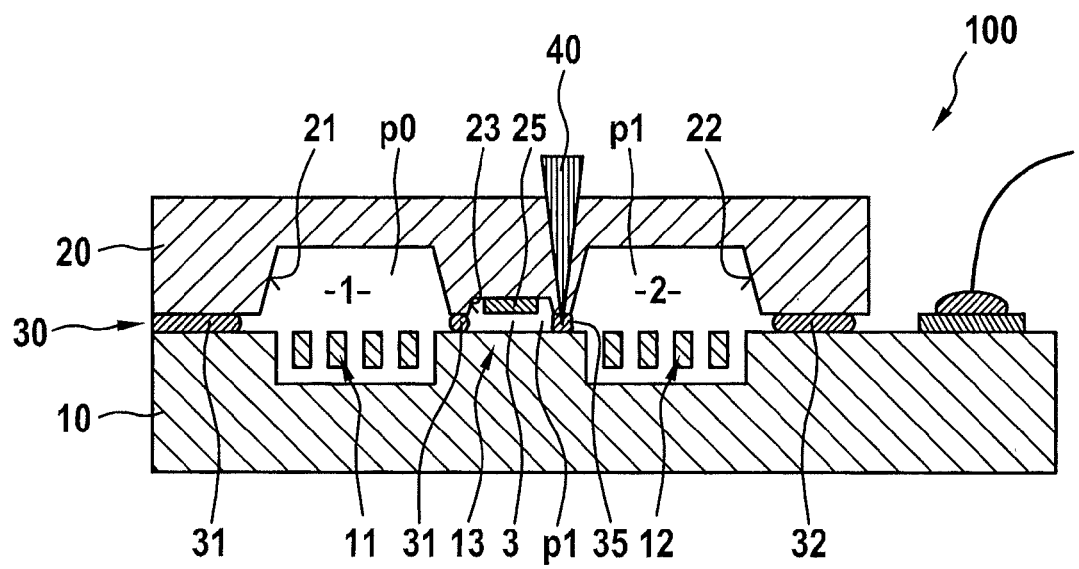
FIG. 1b schematically shows a cross-sectional view of this component 100 during laser welding for closing the connecting opening.

FIGS. 1a and 1b show the connecting concept according to the present invention with which multiple cavities having different defined internal pressures may be hermetically tightly sealed between two elements of a component.

Component 100 shown in FIGS. 1a and 1b includes a MEMS element 10, in whose layer structure two micromechanical structures 11 and 12, which are independent from one another, are formed. These may be, for example, sensor structures, such as an acceleration sensor structure and a rotation rate sensor structure, or also micromechanical actuator structures. The two micromechanical structures 11 and 12 are each situated next to one another and also spatially separated from one another by a frame structure 13 in the layer structure.

A second element 20, which acts as a cap for the two micromechanical structures 11 and 12, is mounted on the layer structure of MEMS element 10. For this purpose, two cap recesses 21 and 22 are formed in the cap bottom side, which are dimensioned and situated according to the micromechanical structures 11 and 12 of MEMS element 10. Between these two cap recesses 21 and 22, a further additional depression 23 is situated on the cap bottom side, into which a getter material 25 was deposited. The depression having this getter material 25 is positioned above MEMS frame structure 13. It should be noted here that instead of the getter material, an out-gassing material might be situated in depression 23.

FIG. 1a shows component 100 after cap element 20 was mounted in a bonding process onto the structured surface of MEMS element 10. The connection between MEMS element 10 and cap element 20 was established in the exemplary embodiment illustrated here using a connecting layer 30, for example, made of glass solder. From this connecting layer 30, a bonding frame structure was structured out which includes a circumferentially closed bonding frame 31 for micromechanical structure 11 and cavity recess 21 and which hermetically tightly seals corresponding cavity 1 between MEMS element 10 and cap element 20. The bonding frame structure also includes a bonding frame 32 for micromechanical structure 12 and cavity recess 22, which is, however, not closed circumferentially. Therefore, there is a pressure connection between corresponding cavity 2 and a further cavity 3, which is enclosed between MEMS framing structure 13 and cap depression 23. The bonding frame structure is designed in such a way that cavities 2 and 3 are together hermetically tightly sealed and are only connected to one another via a connecting opening 33 in the bonding frame structure. This connecting opening 33 must ensure a pressure connection between the two cavities 2 and 3. For this purpose it may be punctiform or it may also extend across a wider surface. In addition, multiple connecting openings may also be provided.

The bond connection between the two elements 10 and 20 may alternatively also be established using a eutectic bonding process, a thermocompression bonding process, or any other bonding process. In this case, the two element surfaces to be joined are provided with structured bonding layers which then form a eutectic connection during the bonding process.

Internal pressure p0 prevailing in cavity 1 essentially corresponds to the ambient pressure which was selected for the bonding process. A significantly lower internal pressure p1 prevails in cavities 2 and 3. This is due to the fact that getter material 25 was activated after establishing the bond connection so that it bound a defined gas volume within cavities 2 and 3. For this purpose, getter material 25 was heated in a targeted manner, for example, with the aid of an infrared laser. The use of an infrared laser enables a locally limited heating of component 100 only in the area of the getter material so that heat-sensitive component parts, such as, for example, circuit components or the organic coating of a micromechanical structure, are protected.

After sought internal pressure p1 has established itself in the two cavities 2 and 3, cavity 3, including getter material 25, is separated from cavity 2 by closing connecting opening 33. This is illustrated in FIG. 1b. Closure 35 is here produced by welding using an infrared laser 40. For this purpose the infrared laser beam is focused through the semiconductor material of cap element 20 onto the area of connecting opening 33. In this way, the semiconductor material of the two element surfaces is in this area melted within a locally limited area until it joins and the two cavities 2 and 3 are hermetically tightly sealed separately from one another. An internal pressure p1 now prevails in the two cavities 2 and 3. Since cavity 2 is free of getter material, internal pressure p1 may also not change here due to post-gettering or uncontrolled outgassing.

The exemplary embodiment described above shows that the pressure within a cavity, which is hermetically tightly sealed in a bonding process between two components, is, on the one hand, a function of the ambient pressure during the bonding process, but, on the other hand, is also a function of whether a getter material or an outgassing material is enclosed in the cavity. The volume of the bound or released gas is a function of the size of the absorbing or outgassing surface and is a function of the temperature. The internal pressure in a cavity may therefore be influenced by the choice of the getter material or the outgassing material, the size of the absorbing or outgassing surface, and the temperature curve after sealing of the cavity, the cavity volume also needing to be taken into account. In this way, the internal pressure of every individual cavity may be set individually.

What is claimed is:

1. A component, comprising:
   at least two semiconductor elements connected to one another via at least one structured connecting layer;
   wherein at least two hermetically tightly sealed cavities are formed between the at least two semiconductor elements, and different defined internal pressures prevail in the at least two hermetically tightly sealed cavities, and wherein at least a first one of the cavities is sealed by a circumferential bonding frame in the connecting layer, and wherein at least a second one of the cavities is at least partially sealed by a welding joint between the at least two semiconductor elements, and wherein a semiconductor material of at least one of the two semiconductor elements is included in the welding joint.

2. The component as recited in claim 1, wherein a metallic coating of least one of the two semiconductor elements is involved in the welding joint.

3. The component as recited in claim 1, wherein the welding joint closes a connecting opening to an additional, hermetically tightly sealed cavity between the two semiconductor elements, and one of a getter material or an outgassing material is situated in the additional, hermetically tightly sealed cavity.

4. A method for manufacturing a component having at least two semiconductor elements connected to one another in such a way that at least two hermetically tightly sealed cavities are formed between the two semiconductor elements, in which cavities different defined internal pressures prevail, the method comprising:
   providing at least one of the two surfaces of the two semiconductor elements to be joined with at least one structured connecting layer; and
   subsequently establishing a bond connection between the two semiconductor elements via the structured connecting layer, wherein at least one of the two cavities is hermetically tightly sealed at a predefined ambient pressure;
   providing at least one additional cavity;
   providing at least one of the two surfaces of the two semiconductor elements to be joined with one of a getter material or an outgassing material in the area of the additional cavity;
   structuring at least the connecting layer in such a way that at least one connecting opening as a pressure connection is provided between the additional cavity and at least one connected cavity after the establishing of the bond connection;
   activating the one of the getter material or the outgassing material after establishing the bond connection so that gasses in the additional cavity and the connected cavity are bound or an outgassing takes place; and
   closing the connecting opening when the sought internal pressure has been established in the at least one connected cavity.

5. The method as recited in claim 4, wherein the connecting opening is closed in a laser welding process with the aid of an infrared laser.

6. The method as recited in claim 5, wherein a hermetically tight welding joint is established in the laser welding process between the semiconductor materials of the two element surfaces to be joined by melting the semiconductor materials of the two element surfaces.

7. The method as recited in claim 4, wherein:
   an eutectic bond connection is established between the two semiconductor elements by: (i) applying and structuring at least one bonding layer on both of the two element surfaces to be joined; and (ii) a hermetically tightly sealed welding connection between the semiconductor material of the one element surface to be joined and the bond material on the other element surface is established during the laser welding process.

8. The method as recited in claim 4, wherein at least one of the two surfaces of the two semiconductor elements to be joined is structured in order to produce recesses for at least one of (i) the at least two cavities and (ii) the at least one additional cavity.

9. The method as recited in claim 4, wherein:
   the two semiconductor elements are each produced in a wafer composite;
   the bonding connection between the two semiconductor elements is established in the wafer composite;
   the subsequent closure of the connecting opening takes place in the wafer composite; and
   the at least one additional cavity is situated in the border area of the component so that the at least one cavity is separated when separating the component.

* * * * *